United States Patent
Li et al.

(10) Patent No.: US 8,053,361 B2
(45) Date of Patent: Nov. 8, 2011

(54) INTERCONNECTS WITH IMPROVED TDDB

(75) Inventors: Jing Hui Li, Chongqing (CN); Wu Ping Liu, Singapore (SG); Lawrence A. Clevenger, LaGrangeville, NY (US)

(73) Assignees: Globalfoundries Singapore Pte. Ltd, Singapore (SG); International Business Machines Corporation

( * ) Notice: Subject to any disclaimer, the term of this patent is extended or adjusted under 35 U.S.C. 154(b) by 113 days.

(21) Appl. No.: 12/203,924

(22) Filed: Sep. 4, 2008

(65) Prior Publication Data
US 2010/0052184 A1    Mar. 4, 2010

(51) Int. Cl.
   *H01L 23/52*    (2006.01)
(52) U.S. Cl. .......... 438/644; 438/643; 257/E21.584
(58) Field of Classification Search .......... 438/618, 438/643, 644, 645; 257/E21.575, E21.584
See application file for complete search history.

(56) References Cited

U.S. PATENT DOCUMENTS

| | | | |
|---|---|---|---|
| 6,146,995 A * | 11/2000 | Ho .................. | 438/637 |
| 7,009,280 B2 * | 3/2006 | Angyal et al. .......... | 257/642 |
| 7,867,917 B2 * | 1/2011 | Hohage et al. .......... | 438/775 |
| 2004/0187304 A1 * | 9/2004 | Chen et al. ............ | 29/830 |
| 2006/0089007 A1 * | 4/2006 | Huang ................ | 438/763 |
| 2007/0023870 A1 * | 2/2007 | Dubois et al. .......... | 257/642 |
| 2009/0039518 A1 * | 2/2009 | Feurprier ............. | 257/773 |

* cited by examiner

*Primary Examiner* — Hsien Ming Lee
*Assistant Examiner* — Michele Fan
(74) *Attorney, Agent, or Firm* — Horizon IP Pte Ltd (57) ABSTRACT

A method for forming a semiconductor device is presented. A substrate prepared with a dielectric layer formed thereon is provided. A first upper etch stop layer is formed on the dielectric layer. The first upper etch stop layer includes a first dielectric material. The dielectric layer and first upper etch stop layer are patterned to form an interconnect opening. The interconnect opening is filled with a conductive material to form an interconnect. The interconnect and first upper etch stop layer have coplanar top surfaces. A second upper etch stop layer is formed over the coplanar top surfaces. The second upper etch stop layer includes a second material having sufficient adhesion with the first material to reduce diffusion of the conductive material.

13 Claims, 6 Drawing Sheets

INTERCONNECTS WITH IMPROVED TDDB

BACKGROUND

The fabrication of integrated circuits (ICs) involves the formation of features on a substrate that make up circuit components, such as transistors, resistors and capacitors. The devices are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, the spacing between two metal lines reduces as well. Moreover, as the CD shrinks, it also provides challenges for liner deposition. Poor liner coverage will lead to the diffusion of the liner material, for example copper, to diffuse into the dielectric layer adjacent thereto. Therefore, time dependent dielectric breakdown (TDDB) has become an important reliability issue. For example, the destruction of the dielectric layer can cause interconnects to short, rendering the IC defective.

From the foregoing discussion, it is desirable to improve TDDB to increase IC reliability.

SUMMARY

A method for forming a semiconductor device is disclosed. The method includes providing a substrate prepared with a dielectric layer formed thereon. A first upper etch stop layer is formed on the dielectric layer. The first upper etch stop layer includes a first dielectric material. The dielectric layer and first upper etch stop layer are patterned to form an interconnect opening. The interconnect opening is filled with a conductive material to form an interconnect. The interconnect and first upper etch stop layer have coplanar top surfaces. The method further includes forming a second upper etch stop layer over the coplanar top surfaces. The second upper etch stop layer includes a second material having sufficient adhesion with the first material to reduce diffusion of the conductive material.

In one embodiment, a semiconductor device is disclosed. The semiconductor device includes a substrate and a dielectric layer on the substrate with an interconnect. A first etch stop layer that includes a first material is disposed on the surface of the dielectric layer. The top surfaces of the interconnect and first etch stop layer are coplanar. The semiconductor device further includes a second etch stop layer disposed on top surfaces of the interconnect and first etch stop layer. The second etch stop layer comprises a second material having sufficient adhesion with the first material to reduce diffusion of conductive material of the interconnect.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or ICs. More particularly, embodiments relate to interconnections and processes used, for example, ICs. The ICs can be any type of IC, for example dynamic or static random access memories, signal processors, or system-on-chip devices. The ICs can be incorporated into, for example, consumer electronic products, such as computers, cell phones, and personal digital assistants (PDAs). Other types of devices or products are also useful.

Figure 1:
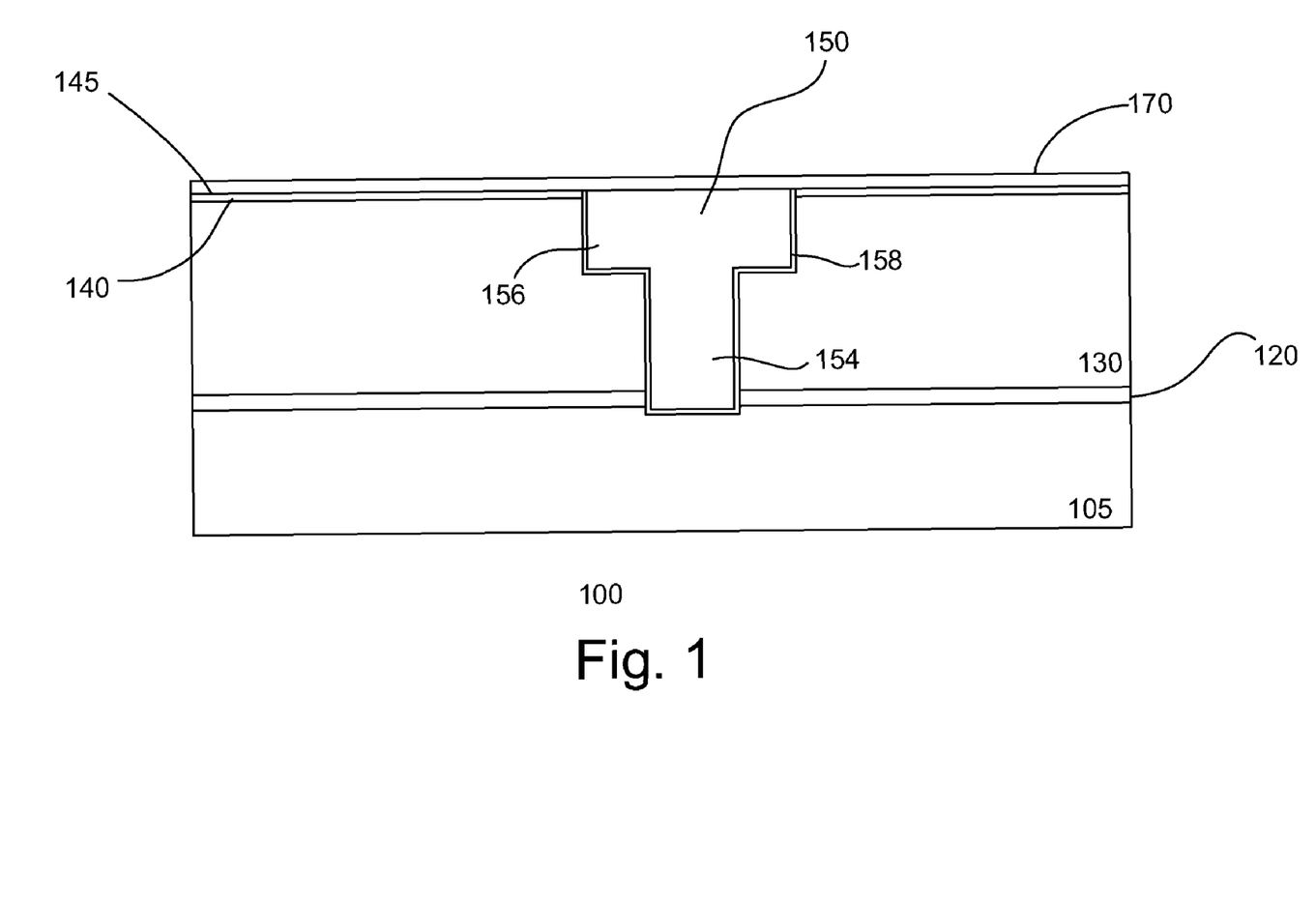
FIG. 1 shows a cross-sectional view of an embodiment of a portion of an IC.

FIG. 1 shows a cross-sectional view of a portion of an integrated circuit (IC) 100 in accordance with one embodiment. As shown, the portion includes a substrate 105. The substrate, for example, comprises a silicon substrate. Other types of substrates, such as silicon germanium or silicon-on-insulator (SOI), are also useful. The substrate may include circuit components (not shown) such as transistors, capacitors, or resistors formed thereon. Other types of circuit components are also useful.

A dielectric layer 130 is disposed on the substrate. The dielectric layer, for example, serves as an interconnect dielectric (ICD) layer in which interconnects are formed. A lower etch stop layer 120 can be provided beneath the ICD layer. The lower etch stop layer can comprise various types of materials. In one embodiment, the lower etch stop layer comprises a dielectric material. The lower etch stop layer, in one embodiment, comprises nitrogen doped BLOK (NBLOK) or low k NBLOK. Other types of etch stop materials such as silicon nitride can also be useful. The thickness of the lower etch stop layer can be about 250-500 Å. Other thicknesses are also useful.

In one embodiment, the ICD includes lower and upper portions. The lower portion serves as an interlevel dielectric (ILD) layer while the upper portion serves as an intrametal dielectric (IMD) layer. The dielectric layer can be a single layer or multi-layered stack. For example, a single layer can be used to serve as both the ILD and IMD or separate layers are used for the ILD and IMD. In some cases, an etch stop layer can be disposed between the ILD and IMD. The ICD comprises a predefined height $H_F$. In embodiment, the ICD comprises the height $H_F$ prior to commencement of forming the interconnects.

The dielectric layer can comprise, for example, silicon oxide. Other types of dielectric materials are also useful. For example, the dielectric layer can comprise doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and porous low-k materials. Preferably, at least the IMD layer comprises a low-k or ultra low-k dielectric material.

An interconnect 150 is formed in the ICD layer. The IC can include numerous interconnects. In one embodiment, the interconnect comprises a conductive line 156 in the upper portion or IMD while a contact 154 is disposed in the lower portion or ILD. The interconnect comprises a conductive material. For example, the conductive material can be any metal or alloy. In one embodiment, the interconnect can comprise copper, aluminum, tungsten, their alloys, or a combination thereof. It is understood that the contacts and conductive line can comprise the same or different materials. The contact connects the conductive line to contact regions below. Depending on the ICD level, the contact region can be another metal line or a device, such as a diffusion region or a gate of a transistor or a plate of a capacitor.

A barrier 158 can be provided to line the sidewalls and bottom of the interconnect. The barrier serves to protect the conductive line from diffusing into dielectric layer. The barrier, for example, can comprise titanium nitride (TiN). Other types of barrier materials, such as TaN, are also useful.

In one embodiment, a first upper etch stop layer 140 is disposed on the surface of the ICD layer. In one embodiment, the top of the first upper etch stop layer 145 is coplanar with a top surface of the conductive line and the barrier. As shown, the barrier separates the conductive line from the first upper etch stop layer. The first upper etch stop comprises a first material which enables the conductive line to be polished selectively. In one embodiment, the first material comprises a dielectric material. The first material, in one embodiment, comprises NBLOK. Other types of etch stop materials, for example low-k NBLOK, are also useful. The thickness of the etch stop layer is about 150-350 Å. Other thicknesses are also useful.

A second upper etch stop layer 170 is provided over the first upper etch stop layer and the interconnect. The second upper etch stop layer comprises a second material. The second upper etch stop layer comprises a material which has good adhesion with the etch stop layer. In one embodiment, the adhesion between the second and first upper etch stop layers is sufficient to prevent or reduce diffusion of conductive material of the conductive line along the interface. The second material, in one embodiment, comprises NBLOK. Other types of dielectric capping materials are also useful. Preferably, the first and second materials comprise the same or similar materials. Providing first and second materials which are the same or similar results in good adhesion between the interface of the etch stop layers, which prevents or reduces diffusion of conductive material of the conductive line. This improves TDDB.

Figure 2A:
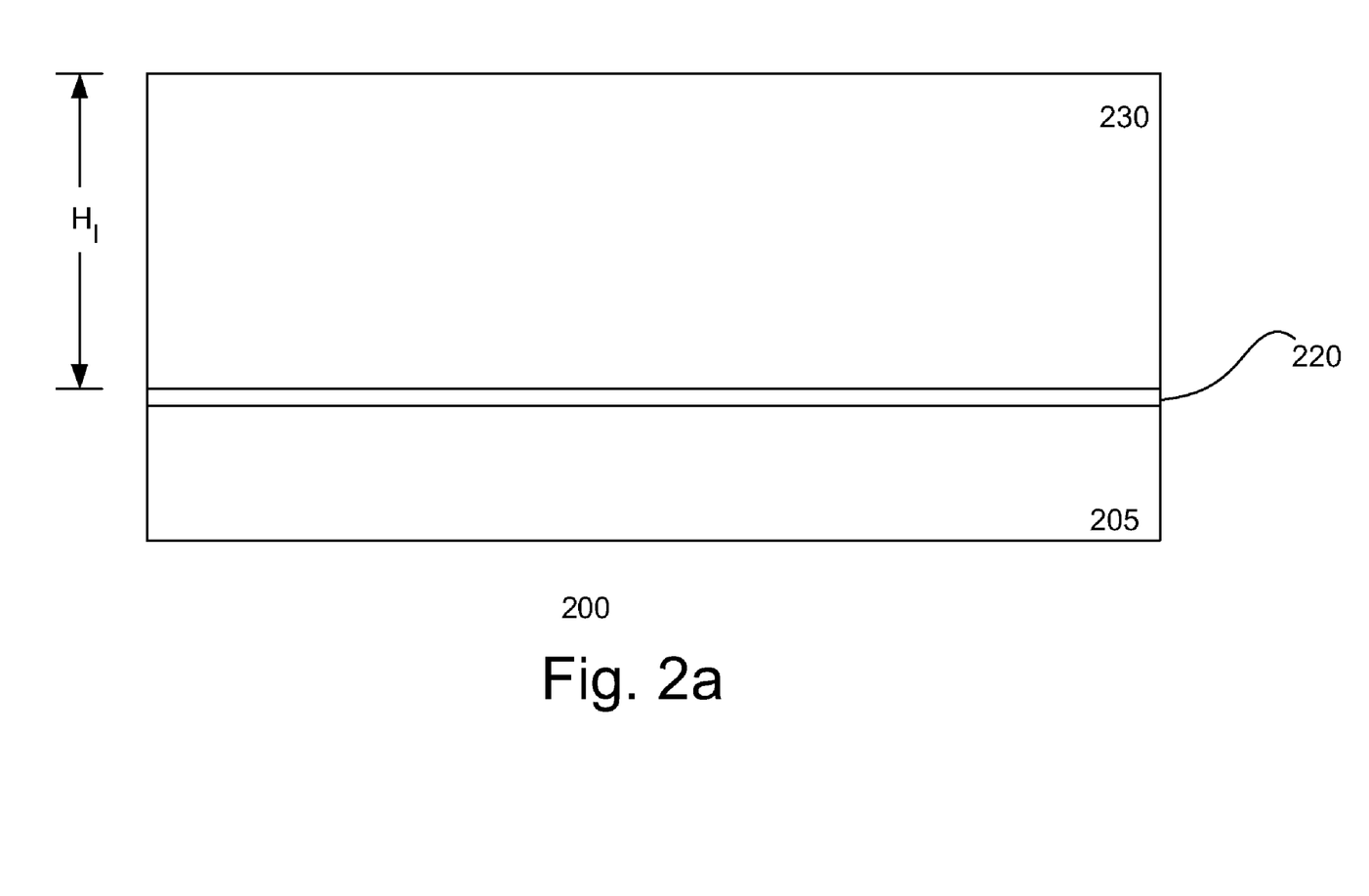
FIGS. 2a-e show a process for forming an embodiment of a portion of an IC.

FIGS. 2a-e show an embodiment of a process for forming a portion 200 of an IC. Referring to FIG. 2a, a substrate 205 is provided. The substrate, in one embodiment, comprises a p-type silicon substrate. Other types of substrates, such as a germanium-based, gallium arsenide, silicon-on-insulator (SOI), or sapphire substrate, are also useful. The substrate can be prepared with circuit components (not shown). Circuit components can include, for example, transistors, capacitors and/or resistors. Other types of circuit components are also useful.

The substrate is further prepared with an ICD layer 230. A lower etch stop layer 220 can be provided beneath the ICD layer. The lower etch stop layer can comprise various types of materials. In one embodiment, the lower etch stop layer comprises a dielectric material such as silicon nitride. Other types of etch stop materials can also be useful. For example, the lower etch stop can comprise NBLOK or low k NBLOK. The thickness of the lower etch stop layer can be about 250-500 Å. Other thicknesses are also useful.

The ICD layer includes an upper or IMD portion and a lower or ILD portion. The ICD can be a single layer or multi-layered stack. For example, a single layer can be used to serve as both the ILD and IMD or separate layers are used for the ILD and IMD. In some cases, an etch stop layer can be disposed between the ILD and IMD. The ICD layer can comprise, for example, silicon oxide. Other types of dielectric materials are also useful. For example, the dielectric layer can comprise doped silicon oxide such as FSG, undoped or doped silicate glasses such as BPSG and PSG, undoped or doped thermally grown silicon oxide, undoped or doped TEOS deposited silicon oxide, and low-k or ultra low-k dielectric materials such as organo-silicate glass (OSG) and porous low-k materials. Preferably, at least the IMD layer comprises a low-k or ultra low-k dielectric material.

The ICD layer, in one embodiment, comprises an initial height $H_I$ when deposited. The initial height $H_I$, for example, is about 2000-5000 Å depending on design requirements and process ability. In one embodiment, $H_I$ is about 2600 Å. Other values for $H_I$ are also useful. The ICD layer or layers can be deposited using various types of deposition techniques. For example, chemical vapor deposition (CVD) processes such as plasma enhanced (PECVD), high density (HDCVD), atmospheric pressure (APCVD) can be used. Other techniques such as spin-on processes are also useful. The specific process, for example, can depend on the type of material used and application.

Figure 2B:
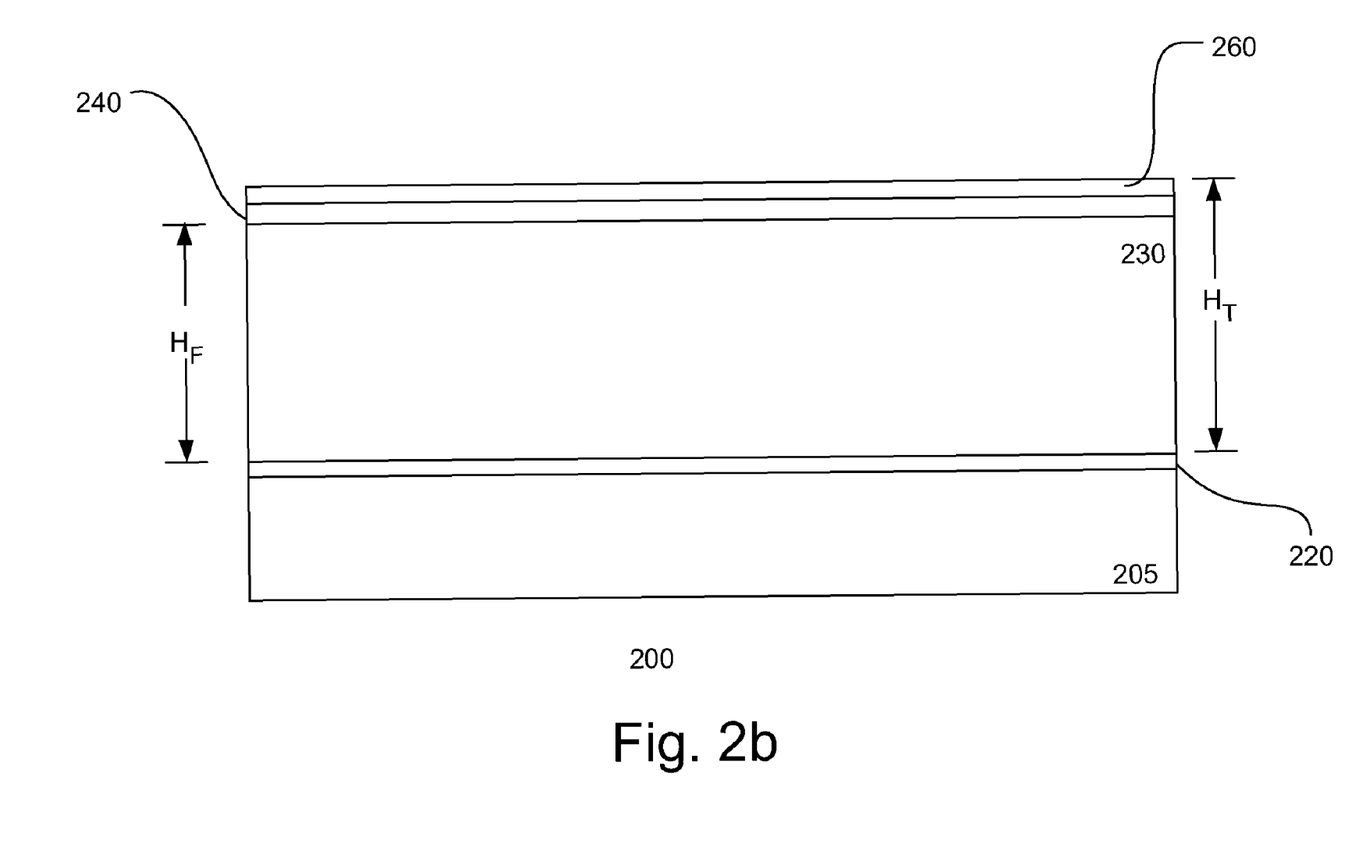

Referring to FIG. 2b, the process continues. In one embodiment, the thickness of the ICD layer is reduced to a height $H_F$. For example, the ICD layer can be recessed to $H_F$ of about 200-600 Å. In one embodiment, $H_F$ is equal to about 2300 Å. Reducing the thickness of the ICD layer to other values of $H_F$ is also useful to obtain better planarization for subsequent processing. The ICD layer can be recessed by, for example, chemical mechanical polishing (CMP). Other techniques for reducing the thickness of the ICD layer can also be used. Alternatively, the ICD layer comprises a height equal to $H_I$ when deposited on the substrate.

A first upper etch stop layer 240 is deposited on the surface of the ICD layer. The first upper etch stop layer is formed by, for example CVD or PECVD. Other techniques for forming the first etch stop layer is also useful. The first etch stop layer comprises a first material. The first material, for example, comprises a material of which a conductive material used for interconnects can be selectively polished. In one embodiment, the first material comprises a dielectric material. The first material, in one embodiment, comprises NBLOK. Other types of etch stop materials, for example, low-k NBLOK, are also useful. The thickness of the first upper etch stop layer can be about 150-350 Å. The thickness can be about 200 Å. Other thicknesses are also useful.

In one embodiment, a mask layer 260 is formed over the first upper etch stop layer. The mask layer comprises, for example, a hard mask layer. The hard mask can comprise TEOS. Other types of hard mask materials are also useful. The thickness of the hard mask can be about 150-850 Å. The hard mask, in one embodiment, is about 500 Å. Other mask thicknesses are also useful. Various techniques, such as CVD, can be used to form the hard mask. The ICD, first upper etch stop and mask layers comprises a total height $H_T$. In one embodiment, $H_T$ can be about 2150-5850 Å. In one embodiment, $H_T$ is about 3000 Å.

In an alternative embodiment, the first upper etch stop layer can also serve as a hard mask. For example, the first upper etch stop layer can be thicker to function as a polish stop and hard mask. In such case, the first upper etch stop layer can be about 350-750 Å thick.

Figure 2C:
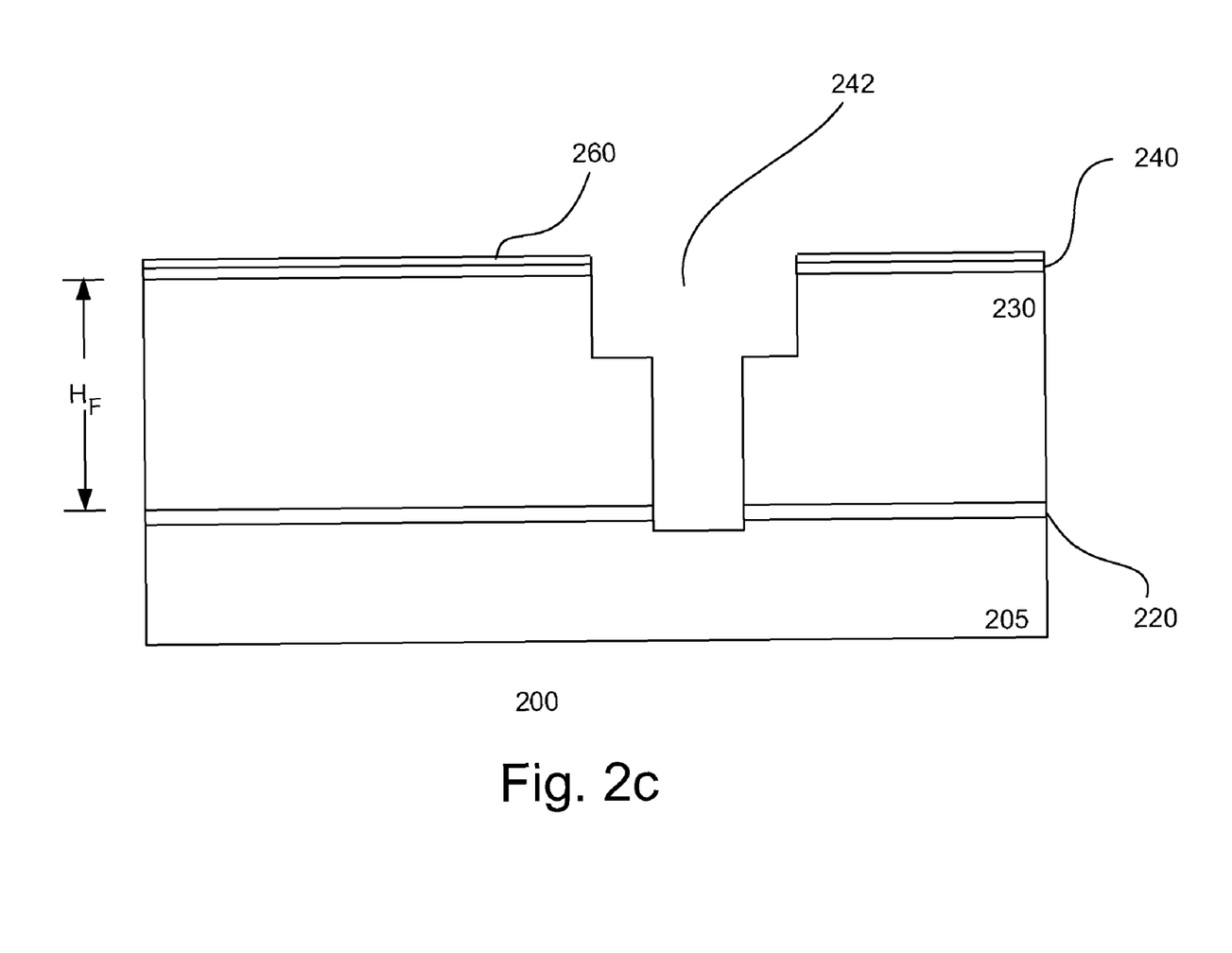

As shown in FIG. 2c, an interconnect opening 242 is formed in the ICD layer. In one embodiment, the interconnect opening comprises a dual damascene opening. The bottom of the interconnect penetrates the lower etch stop layer to expose the contact region below. Various techniques, such as via first and trench first can be used to form the dual damascene opening. Other techniques for forming the dual damascene opening are also useful. An etch stop layer (not shown) may be formed at the interface of the ILD and IMD. In an alternative embodiment, the interconnect opening comprises a damascene opening, such as a trench or a via.

Figure 2D:
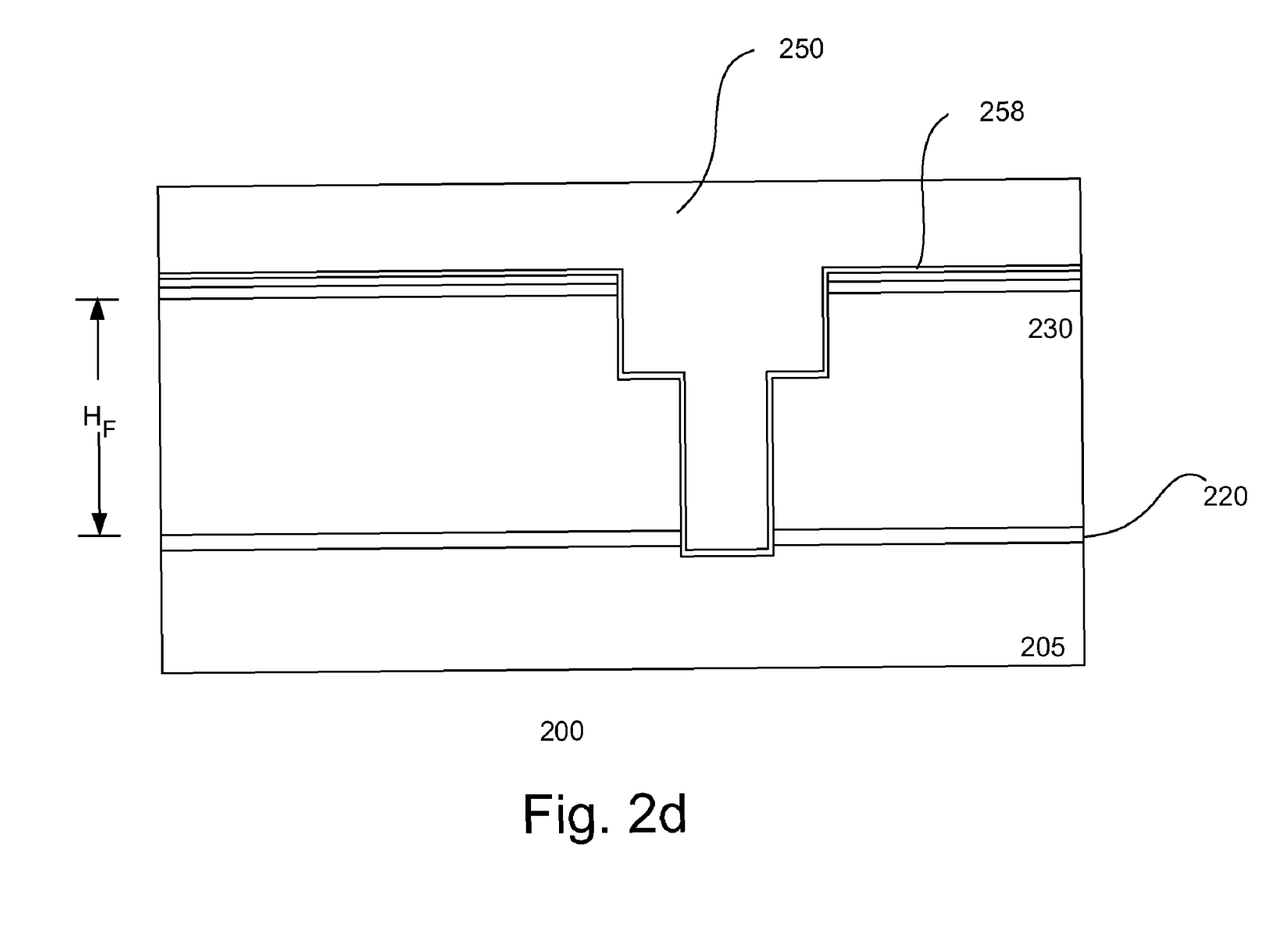

In one embodiment, as shown in FIG. 2d, a barrier 258 is deposited on the substrate which lines the surface of the ICD and interconnect opening. The barrier, for example, can comprise titanium nitride (TiN). Other types of barrier materials, such as TaN, are also useful. The barrier can be formed by, for example, CVD. The barrier, for example, is about 30-150 Å thick.

A conductive material 250 is deposited on the substrate covering and filling the interconnect opening. The conductive material, for example, comprises copper, aluminum, tungsten, alloys thereof or a combination thereof. Other types of conductive materials, including metals and alloys, are also useful. In one embodiment, the conductive material comprises copper. The conductive material can be deposited by electro-plating. Other techniques, such as electro-less plating, physical vapor deposition or sputtering, are also useful. A seed layer may be provided. The seed layer, for example, lines the barrier layer to facilitate forming the conductive material.

Figure 2E:
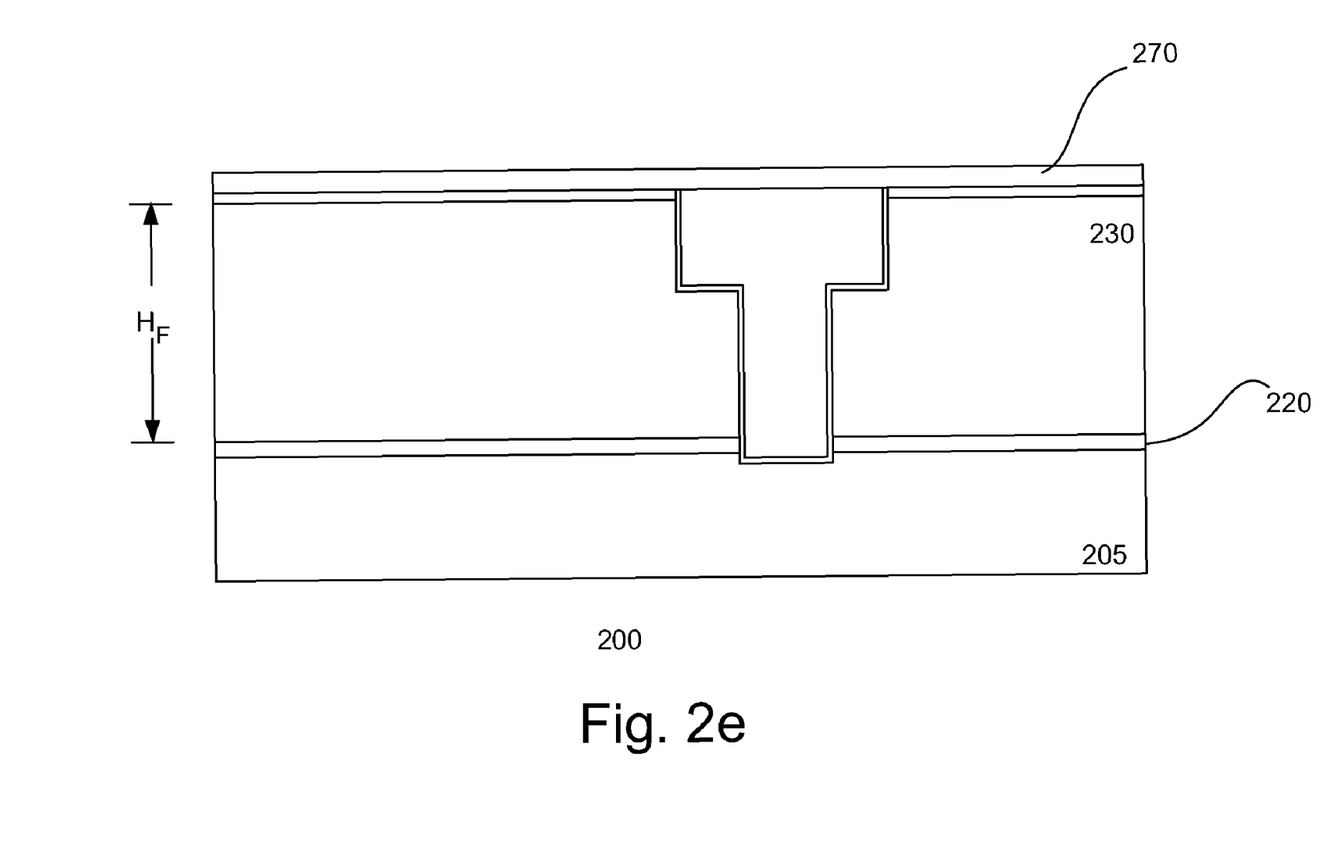

Excess material on the surface of the ICD layer is removed by a planarizing process to form an interconnect having a top surface which is planar with the top surface of the upper etch stop layer. For example, excess conductive and barrier materials on the surface of the ICD layer are removed by a polishing process, such as chemical mechanical polishing. Other types of planarizing or polishing processes are also useful. The polishing process may include multiple polishing steps to remove the different materials. An over-polish can be performed to ensure all barrier material is removed. The over-polish removes some of the first upper etch stop layer. For example, about 100 Å of the first upper etch stop layer is removed, leaving a first upper etch stop layer of about 100 Å thick. Other thicknesses are also useful.

A second upper etch stop layer 270 is deposited on the top surfaces of the first upper etch stop layer and interconnect. The second upper etch stop layer comprises a second material. The second material has good adhesion with the etch stop layer. In one embodiment, the adhesion between the first and second upper etch stop layers should be sufficient to prevent or reduce diffusion of conductive material of the conductive line. For example, the adhesion between the etch stop layers is greater than about 4.9 j/m$^2$. Other adhesion values are also useful. The second material, in one embodiment, comprises NBLOK. Other types of dielectric materials are also useful. Preferably, the first and second materials are the same. The cap layer, for example, is deposited by CVD. Other techniques can also be used. The thickness of the cap layer can be about 200-750 Å. Providing the second upper etch stop layer with other thicknesses are also useful.

In embodiments where the ICD layer is reduced to a thickness $H_F$ or the ICD layer comprises a height equal to $H_I$ when deposited on the substrate, the first upper etch stop layer enables the height of the ICD layer to be the same as that prior to forming the interconnect. This means that there is no reduction in ICD thickness after forming the interconnect. As a result, the opening (e.g., damascene or dual damascene) in the ICD in which the interconnect is formed has a lower aspect ratio compared to that of the thickness of the ICD layer in conventional method. Providing a lower aspect ratio opening facilitates improved barrier coverage and filling with conductive materials. This improves TDDB and reduces problems caused by electro-migration (EM).

The process continues to form the IC. For example, additional processing can include forming more ICD layers and interconnections, final passivation, dicing, assembly and packaging. Other processes are also useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor device comprising:
   providing a substrate prepared with a dielectric layer formed thereon;
   reducing an initial height $H_I$ of the dielectric layer to a thickness with a height $H_F$ prior to forming a first upper etch stop layer so that the height of the dielectric layer following formation of an interconnect is the same as $H_I$ to improve time dependent dielectric breakdown (TDDB);
   forming the first upper etch stop layer on the dielectric layer, the first upper etch stop layer comprising a first material;
   patterning the dielectric layer and first upper etch stop layer to form an interconnect opening;
   filling the interconnect opening with a conductive material to form the interconnect, the interconnect and first upper etch stop layer having coplanar top surfaces; and
   forming a second upper etch stop layer over the coplanar top surfaces and directly contacting the coplanar top surfaces, wherein the second upper etch stop layer comprises a second material similar to the first material to provide sufficient adhesion with the first material to reduce diffusion of the conductive material.

2. The method of claim 1 wherein the first and second materials comprise dielectric materials.

3. The method of claim 2 wherein the dielectric materials comprise Nitrogen doped Silicon Carbide, low k Nitrogen doped Silicon Carbide or a combination thereof.

4. The method of claim 2 wherein the first material comprises Nitrogen doped Silicon Carbide, low k Nitrogen doped Silicon Carbide or a combination thereof.

5. The method of claim 1 comprises providing a mask layer over the first etch stop layer to form the interconnect opening.

6. The method of claim 1 comprises providing a barrier layer lining surfaces of the dielectric layer and the interconnect opening.

7. The method of claim 6 comprises planarizing the conductive and barrier layers on the surface of the dielectric layer to form coplanar top surfaces of the interconnect and first upper etch stop layer.

8. A method for forming a semiconductor device comprising:
   providing a substrate prepared with a dielectric layer and a first upper etch stop layer formed thereon;
   recessing an initial thickness $H_I$ of the dielectric layer to a thickness $H_F$ prior to forming the first upper etch stop layer thereon so that the thickness of the dielectric layer plus the thickness of the first upper etch stop layer equals $H_I$;

forming an interconnect opening in the dielectric and first upper etch stop layers;

filling the interconnect opening with a conductive material to form an interconnect, the interconnect and first upper etch stop layer having coplanar top surfaces; and forming a second upper etch stop layer over the coplanar top surfaces and directly contacting the coplanar top surfaces, wherein the second upper etch stop layer is similar to the first upper etch stop layer and has sufficient adhesion with the first upper etch stop layer to reduce diffusion of the conductive material.

9. The method of claim 8 wherein the first and second upper etch stop layers comprise same material.

10. The method of claim 9 wherein the first and second upper etch stop layers comprise dielectric materials.

11. The method of claim 10 wherein the dielectric materials comprise Nitrogen doped Silicon Carbide, low k Nitrogen doped Silicon Carbide or a combination thereof.

12. The method of claim 8 comprises providing a barrier layer lining surfaces of the dielectric layer and the interconnect opening.

13. The method of claim 12 comprises planarizing the conductive and barrier layers on the surface of the dielectric layer to form coplanar top surfaces of the interconnect and first upper etch stop layer.

* * * * *